(12) United States Patent
Kim et al.

(10) Patent No.: US 11,133,277 B2
(45) Date of Patent: Sep. 28, 2021

(54) SEMICONDUCTOR DEVICE BONDED BY BONDING PADS

(71) Applicant: Samsung Electronics Co., Ltd., Suwon-si (KR)

(72) Inventors: Jin Nam Kim, Hwaseong-si (KR); Tae Seong Kim, Hwaseong-si (KR); Hoon Joo Na, Hwaseong-si (KR); Kwang Jin Moon, Hwaseong-si (KR)

(73) Assignee: Samsung Electronics Co., Ltd.

( * ) Notice: Subject to any disclaimer, the term of this patent is extended or adjusted under 35 U.S.C. 154(b) by 127 days.

(21) Appl. No.: 16/527,323

(22) Filed: Jul. 31, 2019

(65) Prior Publication Data

US 2020/0243466 A1   Jul. 30, 2020

(30) Foreign Application Priority Data

Jan. 28, 2019  (KR) .................. 10-2019-0010373

(51) Int. Cl.
*H01L 23/00* (2006.01)
*H01L 23/48* (2006.01)
*H01L 25/18* (2006.01)
*H01L 23/528* (2006.01)
*H01L 23/522* (2006.01)

(52) U.S. Cl.
CPC ............ *H01L 24/09* (2013.01); *H01L 23/481* (2013.01); *H01L 23/5226* (2013.01); *H01L 23/5283* (2013.01); *H01L 24/33* (2013.01); *H01L 25/18* (2013.01); *H01L 2924/1431* (2013.01); *H01L 2924/1434* (2013.01)

(58) Field of Classification Search
CPC ....... H01L 24/09; H01L 24/33; H01L 23/481; H01L 23/5226; H01L 23/5283; H01L 25/18; H01L 2924/1431; H01L 2924/1434
See application file for complete search history.

(56) References Cited

U.S. PATENT DOCUMENTS

| | | | |
|---|---|---|---|
| 6,642,081 | B1 | 11/2003 | Patti |
| 7,598,523 | B2 | 10/2009 | Luo et al. |
| 8,053,900 | B2 | 11/2011 | Yu et al. |
| 8,134,235 | B2 | 3/2012 | Chiou et al. |

(Continued)

FOREIGN PATENT DOCUMENTS

| | | |
|---|---|---|
| JP | 2008-0205260 | 9/2008 |
| JP | 5304536 | 3/2011 |

(Continued)

*Primary Examiner* — Lex H Malsawma
(74) *Attorney, Agent, or Firm* — Myers Bigel, P.A.

(57) ABSTRACT

A semiconductor device includes a first semiconductor chip having a first bonding layer and a second semiconductor chip stacked on the first semiconductor chip and having a second bonding layer. The first bonding layer includes a first bonding pad, a plurality of first internal vias, and a first interconnection connecting the first bonding pad and the plurality of first internal vias. The second bonding layer includes a second bonding pad bonded to the first bonding pad. An upper surface of the first interconnection and an upper surface of the first bonding pad are coplanar with an upper surface of the first bonding layer. The first interconnection is electrically connected to the plurality of different first internal lines through the plurality of first internal vias.

19 Claims, 12 Drawing Sheets

(56) References Cited

U.S. PATENT DOCUMENTS

| | | |
|---|---|---|
| 8,222,121 B2 | 7/2012 | Patti et al. |
| 8,368,222 B2 | 2/2013 | Okuyama |
| 8,742,585 B2 | 6/2014 | Okuyama |
| 8,896,125 B2 | 11/2014 | Kagawa et al. |
| 9,269,680 B2 | 2/2016 | Okuyama |
| 9,343,498 B2 | 5/2016 | Saito |
| 9,679,937 B2 | 6/2017 | Okuyama |
| 9,852,988 B2 | 12/2017 | Enquist et al. |
| 9,941,243 B2 | 4/2018 | Kim et al. |
| 9,941,323 B2 | 4/2018 | Okuyama |
| 2011/0042814 A1* | 2/2011 | Okuyama ......... H01L 27/14634 257/758 |
| 2013/0009321 A1* | 1/2013 | Kagawa ................ H01L 24/05 257/774 |
| 2013/0134548 A1* | 5/2013 | Torii ................ H01L 21/76898 257/508 |
| 2014/0011324 A1* | 1/2014 | Liu ........................ H01L 24/27 438/107 |
| 2014/0117546 A1* | 5/2014 | Liu .................. H01L 23/53295 257/751 |
| 2016/0141249 A1* | 5/2016 | Kang ...................... H01L 24/80 257/751 |
| 2017/0287864 A1 | 10/2017 | Yu et al. |

FOREIGN PATENT DOCUMENTS

| | | |
|---|---|---|
| JP | 5383874 | 10/2012 |
| JP | 6017297 | 6/2014 |

* cited by examiner

SEMICONDUCTOR DEVICE BONDED BY BONDING PADS

CROSS-REFERENCE TO RELATED APPLICATION

This application claims from Korean Patent Application No. 10-2019-0010373, filed on Jan. 28, 2019, the disclosure of which is incorporated herein by reference in its entirety.

FIELD

Embodiments described herein relate to semiconductor devices having bonding pads.

BACKGROUND

During semiconductor processing, wafers may be bonded to each other so as to obtain a highly integrated semiconductor device. When the wafers are bonded to each other, bonding pads formed on the wafer are connected to interconnections of the wafers and thus a redistribution layer may be used to connect the bonding pads and the interconnections.

SUMMARY

Example embodiments of the inventive concept are directed to providing a semiconductor device having bonding pads and interconnections at a bonding interface of a bonding layer.

According to example embodiments, a semiconductor device includes a first semiconductor chip including a first substrate, a first circuit layer on the first substrate and having a plurality of first internal lines, and a first bonding layer on the first circuit layer; and a second semiconductor chip stacked on the first semiconductor chip and including a second substrate, a second circuit layer below the second substrate, and a second bonding layer below the second circuit layer. The first bonding layer includes a first bonding pad, a plurality of first internal vias, and a first interconnection electrically connecting the first bonding pad and the plurality of first internal vias. The second bonding layer includes a second bonding pad bonded to the first bonding pad. An upper surface of the first interconnection and an upper surface of the first bonding pad are coplanar with an upper surface of the first bonding layer. The first interconnection is electrically connected to the plurality of different first internal lines through the plurality of first internal vias.

According to example embodiments, a semiconductor device includes a first semiconductor chip including a first substrate, a first circuit layer on the first substrate, and a first bonding layer on the first circuit layer; and a second semiconductor chip stacked on the first semiconductor chip and including a second substrate, a second circuit layer below the second substrate and including a plurality of second internal lines, and a second bonding layer below the second circuit layer. The first bonding layer includes a plurality of first bonding pads and a first interconnection connecting the plurality of first bonding pads. The second bonding layer includes a plurality of second bonding pads and a second interconnection connecting the plurality of second bonding pads and a plurality of second internal vias, the second bonding pads bonded to the plurality of first bonding pads. A lower surface of the second interconnection is coplanar with respective lower surface of the second bonding pads. The plurality of second bonding pads are connected to the plurality of different second internal lines through the plurality of second internal vias.

According to example embodiments, a semiconductor device includes a first semiconductor chip including a first substrate, and a plurality of first internal lines, and a first bonding layer on the plurality of first internal lines; and a second semiconductor chip stacked on the first semiconductor chip and including a second substrate, and a second bonding layer below the second substrate. The first bonding layer includes a first bonding pad, at least one non-bonding pad, and a first interconnection connecting the first bonding pad and the at least one non-bonding pad. The second bonding layer includes a second bonding pad bonded to the first bonding pad. An upper surface of the first interconnection and an upper surface of the first bonding pad are coplanar with an upper surface of the first bonding layer. The at least one non-bonding pad has a width greater than a width of the first interconnection and less than a width of the first bonding pad in plan view. The first interconnection is connected to the plurality of first internal lines through the at least one non-bonding pad.

DETAILED DESCRIPTION OF EXEMPLARY EMBODIMENTS

Figure 1:
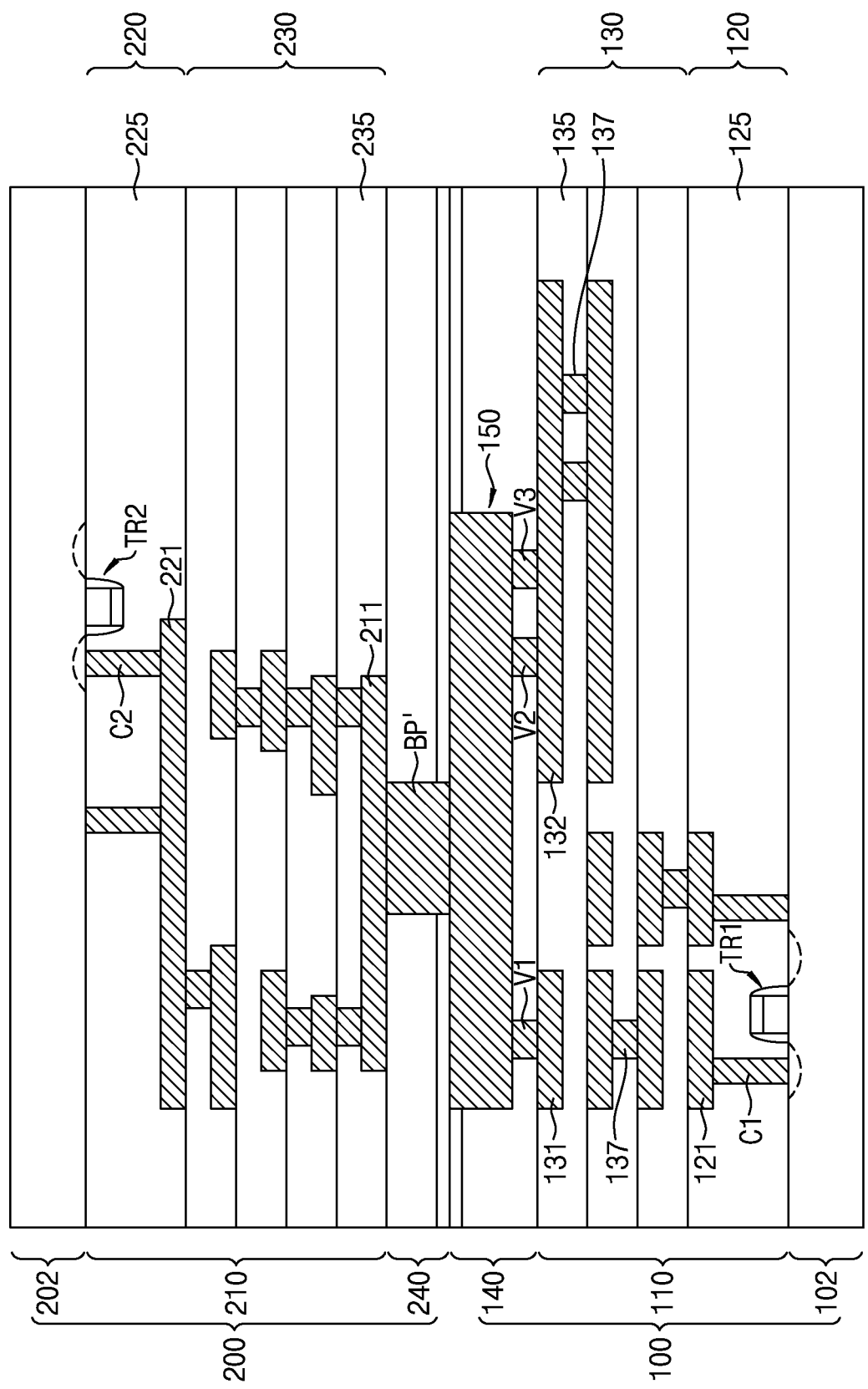
FIG. 1 is a cross-sectional view of a semiconductor device according to an example embodiment.
Figure 2:
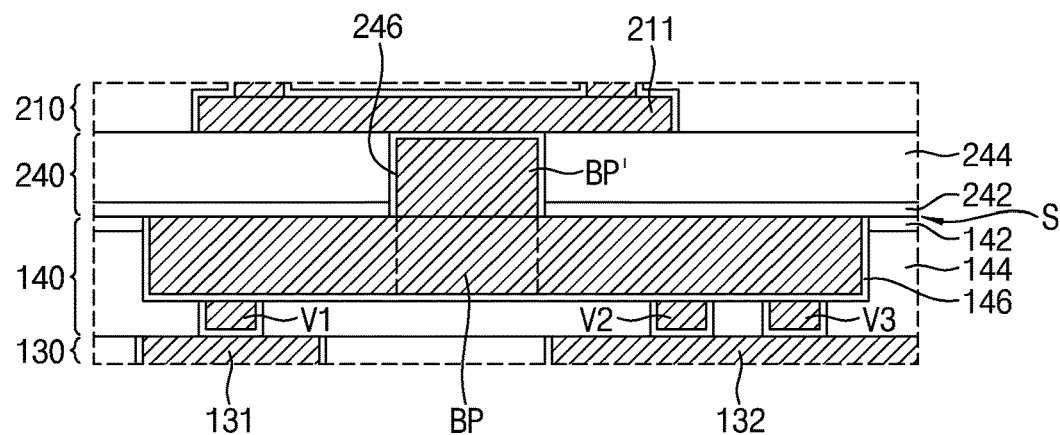
FIG. 2 is a partial enlarged cross-sectional view of the semiconductor device illustrated in FIG. 1.
Figure 3:
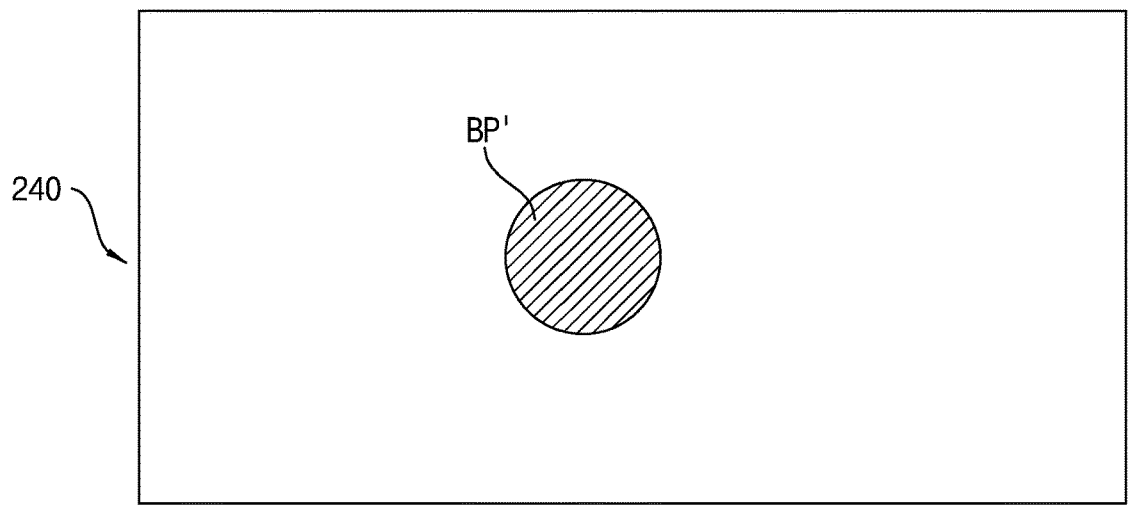
FIG. 3 illustrates plan views of a first bonding layer and a second bonding layer of the semiconductor device illustrated in FIG. 1.
Figure 3:
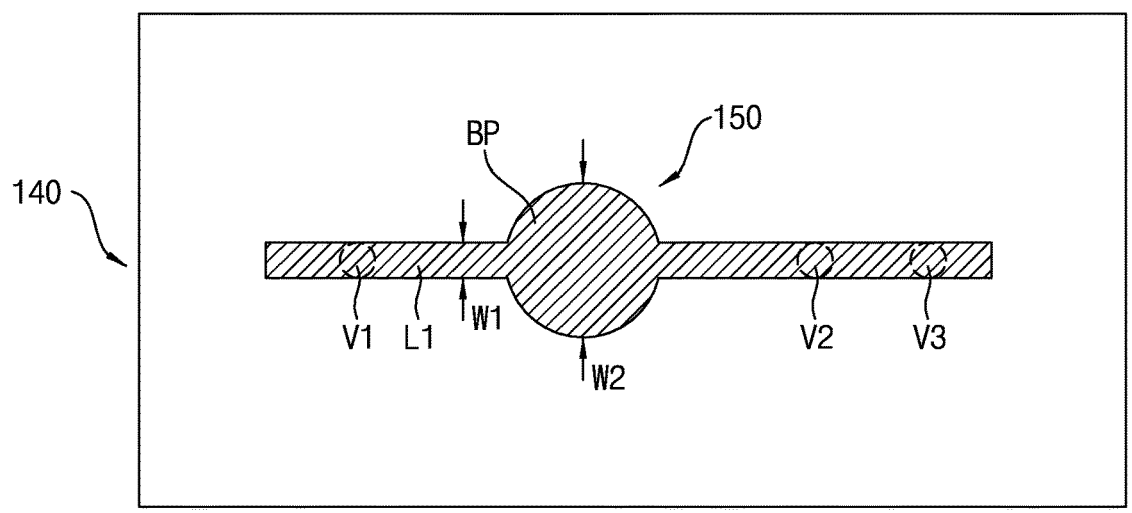

FIG. 1 is a cross-sectional view of a semiconductor device according to an example embodiment. FIG. 2 is a partial enlarged cross-sectional view of the semiconductor device illustrated in FIG. 1. FIG. 3 illustrates plan views of a first bonding layer and a second bonding layer of the semiconductor device illustrated in FIG. 1. In particular, FIG. 3 illustrates a top plan view of the first bonding layer illustrated in FIG. 1 and a bottom plan view of the second bonding layer illustrated in FIG. 1. The terms first, second, third, etc. are used herein merely to distinguish or differentiate one element from another.

Referring to FIGS. 1 and 2, the semiconductor device may include a first semiconductor chip 100 and a second semiconductor chip 200. The second semiconductor chip 200 is stacked on the first semiconductor chip 100 and may be physically and electrically connected to the first semiconductor chip 100.

The first semiconductor chip 100 may include a first substrate 102, a first circuit layer 110, and a first bonding layer 140. The first substrate 102 may include silicon, silicon germanium, silicon carbide, silicon oxide, or a combination thereof.

The first circuit layer 110 may include a first element layer 120 and a first interconnection layer 130. The first element layer 120 may include an internal line 121, an interlayer insulating layer 125, a contact C1, and a transistor TR1. The internal line 121 may be provided in the first element layer 120 to be electrically connected to the first interconnection layer 130. The transistor TR1 may be provided on an upper surface of the first substrate 102. The first substrate 102 may include impurity regions on the upper surface thereof. The impurity regions may be provided at both sides of the transistor TR1. The internal line 121 may be electrically connected to the impurity regions through the contact C1. The interlayer insulating layer 125 may extend on or cover the internal line 121, the contact C1, and the transistor TR1. As used herein, an element that covers another element or surface may partially or completely cover the element or surface. The internal line 121 and the contact C1 may include tungsten, cobalt, copper, or aluminum. Although not shown, the first element layer 120 may further include a barrier film covering the internal line 121 and the contact C1. The interlayer insulating layer 125 may include silicon oxide, silicon nitride, silicon oxynitride, or a combination thereof.

The first interconnection layer 130 may include a plurality of layers. For example, the first interconnection layer 130 may have a structure in which internal lines 131 and 132 and an interlayer insulating layer 135 are stacked. The first interconnection layer 130 may include a via 137 through which interconnections located at different layers are electrically connected. The internal line 131 of the first interconnection layer 130 may be electrically connected to the internal line 121 of the first element layer 120. The internal lines 131 and 132 and the via 137 may include tungsten, copper, cobalt, ruthenium, molybdenum, or aluminum. The first interconnection layer 130 may further include a barrier film covering the internal lines 131 and 132 and the via 137. The interlayer insulating layer 135 may include silicon oxide, silicon nitride, silicon oxynitride, a low-K dielectric material, or a combination thereof.

The second semiconductor chip 200 may include a second substrate 202, a second circuit layer 210, and a second bonding layer 240. The second circuit layer 210 may include a second element layer 220 and a second interconnection layer 230. The second element layer 220 may include an internal line 221, an interlayer insulating layer 225, a contact C2, and a transistor TR2. The second interconnection layer 230 may include an internal line 211 and an interlayer insulating layer 235.

The first semiconductor chip 100 and the second semiconductor chip 200 may be different types of semiconductor chips, that is, semiconductor chips including different structures and configurations. In some embodiments, the first semiconductor chip 100 may be a logic chip, and the second semiconductor chip 200 may be a memory chip including memory structures (e.g., bit lines, word lines, etc.) that are not present in the logic chip 100. In some embodiments, the first semiconductor chip 100 may be a logic chip, and a second semiconductor chip 200 may be a pixel array chip including pixel structures (e.g., photoelectric conversion regions) that are not present in the logic chip 100. In some embodiments, the first semiconductor chip 100 and the second semiconductor chip 200 may be the same type of semiconductor chips.

Referring to FIGS. 2 and 3, the first bonding layer 140 and the second bonding layer 240 may be bonded to each other along a bonding interface or surface S. The first bonding layer 140 may include a first interfacial insulating layer 142, an interlayer insulating layer 144, and a bonding structure 150. The first bonding layer 140 may further include a barrier film 146 and internal vias V1, V2, and V3.

The first interfacial insulating layer 142 may be provided on an upper surface of the first bonding layer 140 and may partially cover side surfaces of the bonding structure 150. For example, the first interface insulating layer 142 may be provided on an upper surface of the first interlayer insulating layer 144, and the first interface insulating layer 142 may extends on the interlayer insulating layer 144. An upper surface of the first interfacial insulating layer 142 and an upper surface of the bonding structure 150 may be coplanar with each other. For example, the upper surface of the first interfacial insulating layer 142 and the upper surface of the bonding structure 150 may be located at the same level as the bonding surface S.

The interlayer insulating layer 144 may be located below the first interfacial insulating layer 142 and may cover the bonding structure 150 and the internal vias V1, V2, and V3. The interlayer insulating layer 144 may protect and electrically insulate the bonding structure 150 and the internal vias V1, V2, and V3. The barrier film 146 may cover side surfaces and a lower surface of the bonding structure 150. The barrier film 146 may also be provided on side surfaces of the internal vias V1, V2, and V3 and the internal lines 131 and 132.

The first interfacial insulating layer 142 may include $SiO_2$, SiCN, SiC, SiON, or a combination thereof. The interlayer insulating layer 144 may include $SiO_2$, SiN, a low-K dielectric material, or a combination thereof. For example, the first interfacial insulating layer 142 provided on the interlayer insulating layer 144 including $SiO_2$ or SiN may include $SiO_2$, SiCN, SiC, SiON, or a multilayer structure including $SiO_2$, SiCN, SiC, and SiON.

The bonding structure 150 may include a bonding pad BP and an interconnection L1. The bonding pad BP is illustrated as having a circular shape but is not limited thereto and may have a polygonal or tetragonal shape, a polygonal or tetragonal shape with round corners, or the like. The interconnection L1 may connect the bonding pad BP and the internal vias V1, V2, and V3. In some embodiments, the interconnection L1 may be formed to pass through the bonding pad BP when viewed from above. In some embodiments, the interconnection L1 may be connected to one side of the bonding pad BP. The bonding pad BP and the interconnection L1 may be formed by a damascene process. In some embodiments, the bonding pad BP and the interconnection L1 may be formed by a single damascene process after the internal vias V1, V2, and V3 are formed. The barrier film 146 may also be provided between the interconnection L1 and the internal vias V1, V2, and V3. In some embodiments, the bonding pad BP, the interconnection L1, and the internal vias V1, V2, and V3 may be formed by a dual damascene process.

In some embodiments, the internal vias V1, V2, and V3 may be spaced apart from the bonding pad BP in a lateral direction and may be provided below interconnection L1. In some embodiments, the internal vias V1, V2, and V3 may be provided below the bonding pad BP. FIG. 3 illustrates that the interconnection L1 is connected to the plurality of internal vias V1, V2, and V3, but in some embodiments, the interconnection L1 may be connected to fewer internal vias or one internal via. A width W1 of the interconnection L1 may be less than a width W2 of the bonding pad BP in plan view. The width W2 of the bonding pad BP may be in the range of about 0.2 µm to about 2.5 µm.

The bonding pad BP, the interconnection L1, and the internal vias V1, V2, and V3 may include a metal. In some embodiments, the bonding pad BP, the interconnection L1, and the internal vias V1, V2, and V3 may include Cu, Al, Co, or a combination thereof. The barrier film 146 may include TaN, Ta, Ti, TiN, Mn, MnN, or a combination thereof. A film including Mn, Co, Ru, Sn, CoWP, Au, Pt, Ni, or a combination thereof may be provided on the bonding pad BP and the interconnection L1.

The second bonding layer 240 may include a second interfacial insulating layer 242, an interlayer insulating layer 244, and a bonding pad BP'. The second bonding layer 240 may further include a barrier film 246. The second interfacial insulating layer 242 may include the same material as the first interfacial insulating layer 142, and the interlayer insulating layer 244 may include the same material as the interlayer insulating layer 144. The bonding pad BP' may include the same material as the bonding pad BP. The first interfacial insulating layer 142 and the second interfacial insulating layer 242 may be provided on the bonding surface S to increase adhesion between the first semiconductor chip 100 and the second semiconductor chip 200. For example, the second interface insulating layer 242 may be provided on a lower surface of the second bonding layer 240, and the second interface insulating layer 242 may extends on the interlayer insulating layer 244. In addition, the second interfacial insulating layer 242 may prevent the metal material of the interconnection L1, which is not in contact with the bonding pad BP', from diffusing into the interlayer insulating layer 244.

The bonding pad BP may be bonded to the bonding pad BP'. The interconnection L1 may be provided on the upper surface of the first bonding layer 140 to perform routing. For example, the bonding pad BP bonded to the bonding pad BP' may be electrically connected to one or more internal vias through the interconnection L1. The bonding pad BP may be electrically connected to the internal vias V1, V2, and V3 through the interconnection L1. Thus, the bonding pad BP may be electrically connected to the internal lines 131 and 132, which are different. FIG. 3 illustrates that the bonding structure 150 is included in the first bonding layer 140 but the embodiments are not limited thereto. In some embodiments, similarly, a bonding structure including an interconnection may be provided on a lower surface of the second bonding layer 240.

As illustrated in FIGS. 1 to 3, the bonding pad BP and the interconnection L1 are provided on the bonding surface S of the first bonding layer 140 of the first semiconductor chip 100 and thus a bonding function and an interconnection function may be performed on the bonding surface S. Even when the bonding pad BP and the bonding pad BP' are misaligned (e.g., deviate from a desired overlap along the bonding surface S) and bonded to each other, a contact area may be secured by the interconnection L1, thereby reducing a bonding risk. Since the bonding pad BP and the bonding pad BP' are not configured for one-to-one bonding, the first semiconductor chip 100 and the second semiconductor chip 200 may be bonded to each other in various patterns of the bonding pad BP and the interconnection L1.

Figure 4:
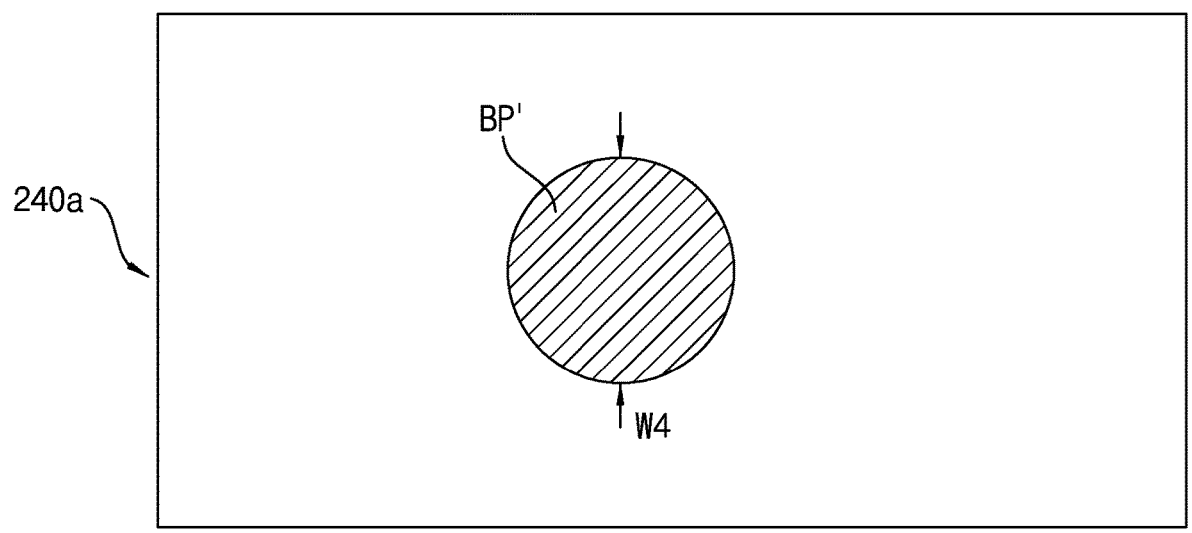
FIG. 4 illustrates plan views of a first bonding layer and a second bonding layer of a semiconductor device according to an example embodiment.
Figure 4:
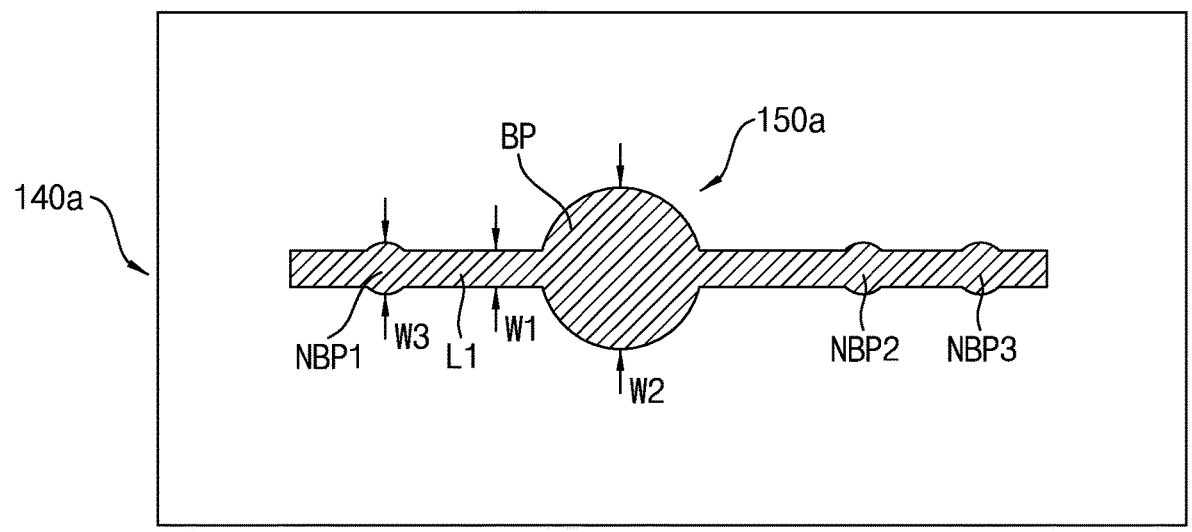

FIG. 4 illustrates plan views of a first bonding layer and a second bonding layer of a semiconductor device according to an example embodiment.

Referring to FIG. 4, a first bonding layer 140a may include a bonding structure 150a. An interconnection L1 may have protruding portions in plan view. In some embodiments, a width W3 of the protruding portions may be greater than a width W1 of the interconnection L1 in plan view. The protruding portions are not connected to a bonding pad BP' and may be referred to as non-bonding pads NBP1, NBP2, and NBP3. The non-bonding pads NBP1, NBP2, and NBP3 may be formed by a dual damascene process together with a bonding pad BP and the interconnection L1. In some embodiments, the width W3 of the non-bonding pad NBP may be less than a width W2 of the bonding pad BP in plan view.

A second bonding layer 240a may include the bonding pad BP'. The bonding pad BP' may be connected to the bonding pad BP. A width W4 of the bonding pad BP' may be different from the width W2 of the bonding pad BP in plan view. In some embodiments, the width W4 of the bonding pad BP' may be greater than the width W2 of the bonding pad BP. In some embodiments, the width W4 of the bonding pad BP' may be less than the width W2 of the bonding pad BP.

Figure 5:
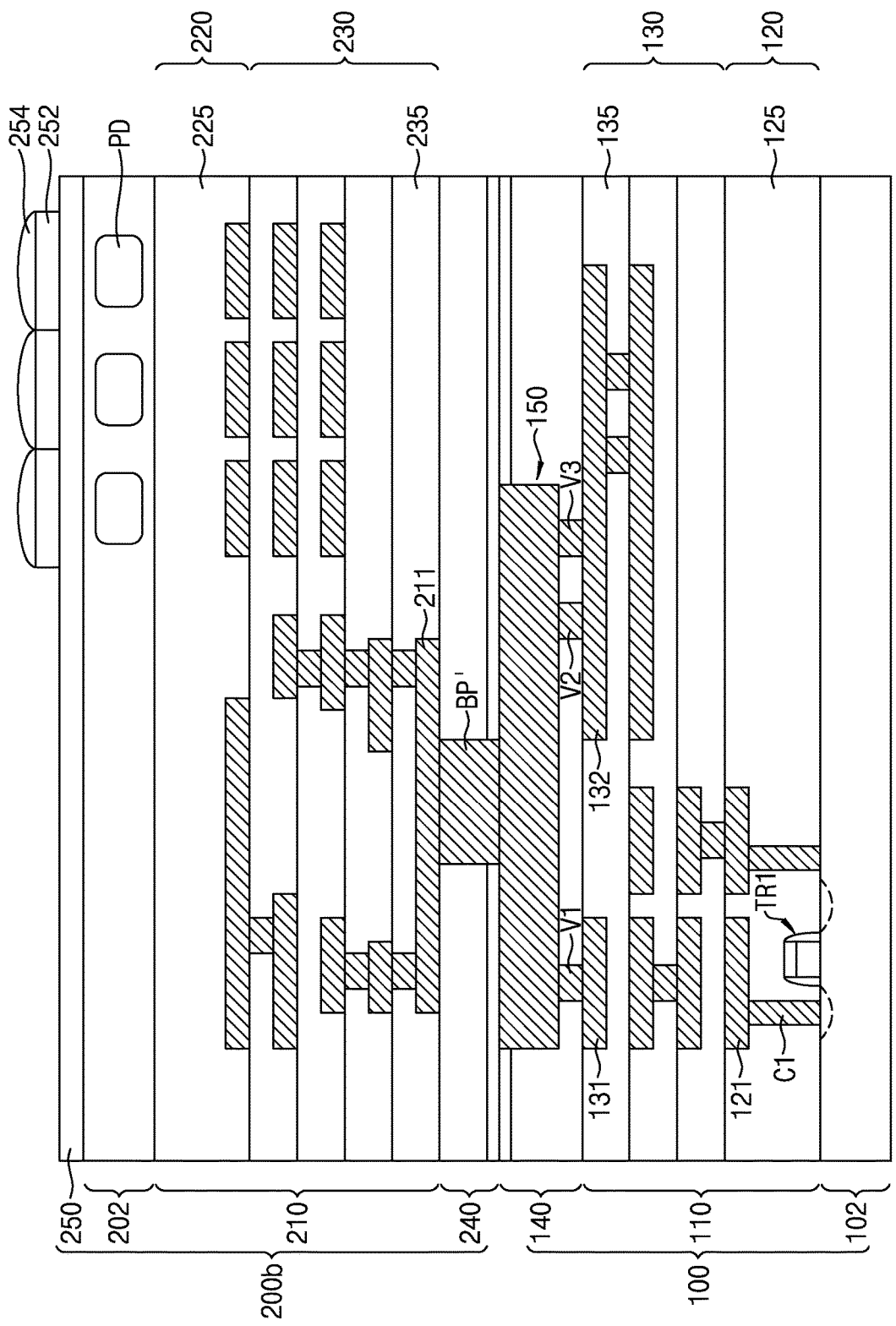
FIGS. 5 and 6 are cross-sectional views of semiconductor devices according to example embodiments.
Figure 6:
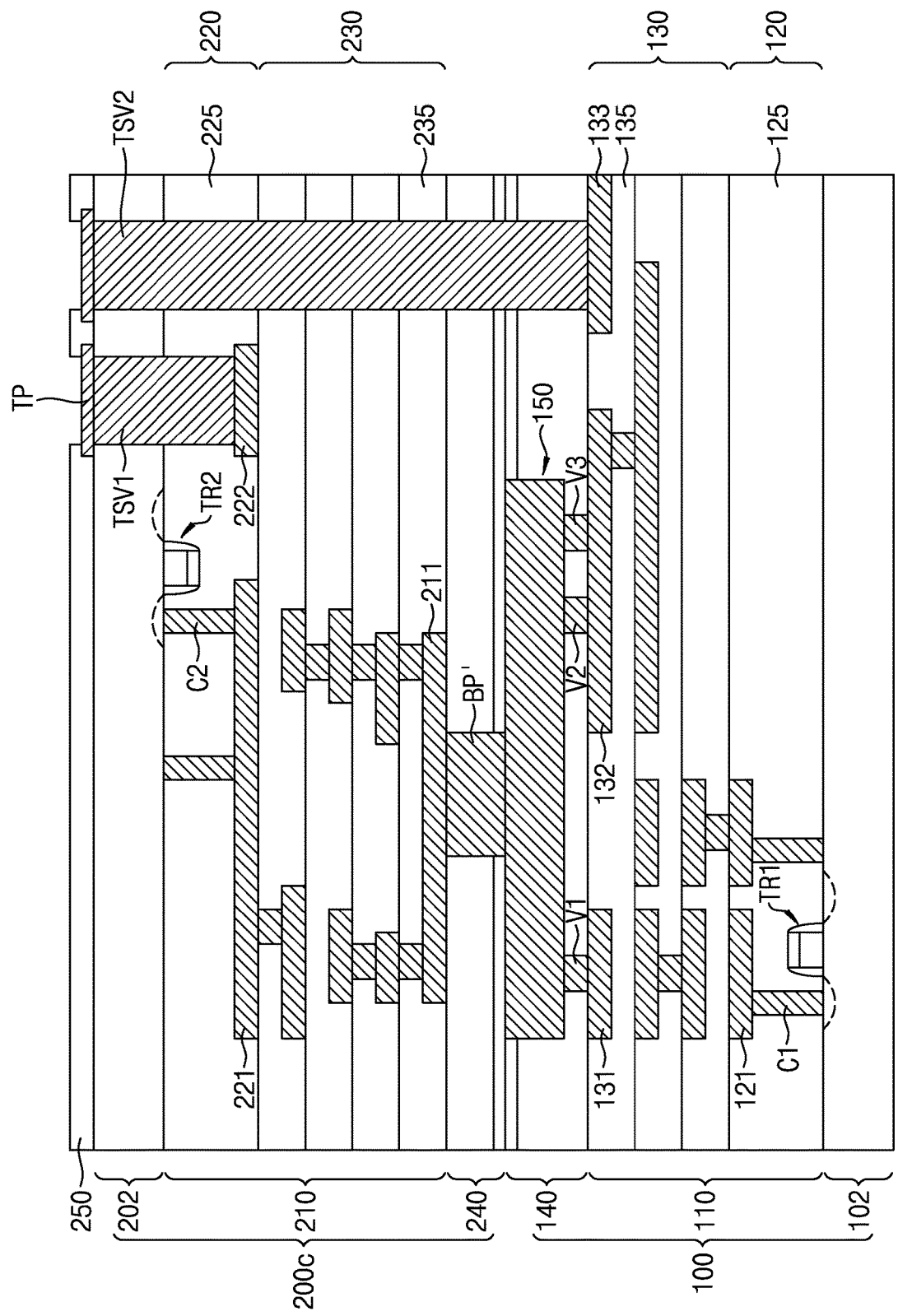

FIGS. 5 and 6 are cross-sectional views of semiconductor devices according to example embodiments.

Referring to FIG. 5, the semiconductor device may include a first semiconductor chip 100 and a second semiconductor chip 200b. In some embodiments, the second semiconductor chip 200b may be a rear light-receiving image sensor. The second semiconductor chip 200b may include a photoelectric conversion part or region PD, a passivation layer 250, color filters 252, and micro-lenses 254. The photoelectric conversion part PD may be provided inside the second substrate 202. The passivation layer 250 may be provided on the second substrate 202. The color filters 252 and the micro-lenses 254 may be provided on the passivation layer 250.

The photoelectric conversion part PD may include an n-type region containing n-type impurity ions such as phosphorus (P) or arsenic (As), and a p-type region containing p-type impurity ions such as boron (B). The photoelectric conversion part PD may include a photodiode, a phototransistor, a photogate, a pinned photodiode, or a combination thereof.

The passivation layer 250 may include silicon oxide, silicon nitride, silicon oxynitride, or other insulating materials. The color filters 252 and the micro-lenses 254 may include a polymeric material. In some embodiments, the passivation layer 250 may include an anti-reflective layer.

The plurality of color filters 252 may be implemented in a bayer pattern including a red filter R, a green filter G, or a blue filter B for each unit pixel. Wavelengths of a red region among wavelengths of visible regions may pass the red filter R. Wavelengths of a green region among the wavelengths of the visible regions may pass the green filter G. Wavelengths of a blue region among the wavelengths of the visible regions may pass the blue filter B. In some embodiments, the plurality of color filters 252 may include a cyan filter, a magenta filter, or a yellow filter. The plurality of color filters 252 may further include a white filter.

Referring to FIG. 6, the semiconductor device may include a first semiconductor chip 100 and a second semiconductor chip 200c. The second semiconductor chip 200c may include a second substrate 202, a second circuit layer 210, and a second bonding layer 240. The second circuit layer 210 may include a second element layer 220 and a second interconnection layer 230. The second element layer 220 may include internal lines 221 and 222. The second semiconductor chip 200c may further include a through silicon via TSV1. The through silicon via TSV1 may be formed to partially pass through the second substrate 202 and the second element layer 220 starting from an upper surface of the second substrate 202. A top pad TP may be provided on an upper surface of the through silicon via TSV1. A lower surface of the through silicon via TSV1 may be connected to the internal line 222. The passivation layer 250 may be provided on the surface of the second substrate 202 and may cover a portion of the top pad TP.

Although not shown, the second semiconductor chip 200c may further include a barrier film covering the through silicon via TSV1. The top pad TP and the through silicon vias TSV1 and TSV2 may include Cu, CuSn, CuMg, CuNi, CuZn, CuPd, CuAu, CuRe, CuW, W, or a combination thereof. The barrier film covering the through silicon via TSV1 may include at least one material selected from among W, WN, WC, Ti, TiN, Ta, TaN, Ru, Co, Mn, WN, Ni, or NiB. The barrier film may be a single film or multiple films.

In some embodiments, the second semiconductor chip 200c may further include the through silicon via TSV2. The through silicon via TSV2 may be formed to pass through the second substrate 202, the second element layer 220, the second interconnection layer 230, the second bonding layer 240, and the first bonding layer 140 starting from the upper surface of the second substrate 202. A lower surface of the through silicon via TSV2 may be connected to the internal line 133.

Figure 7:
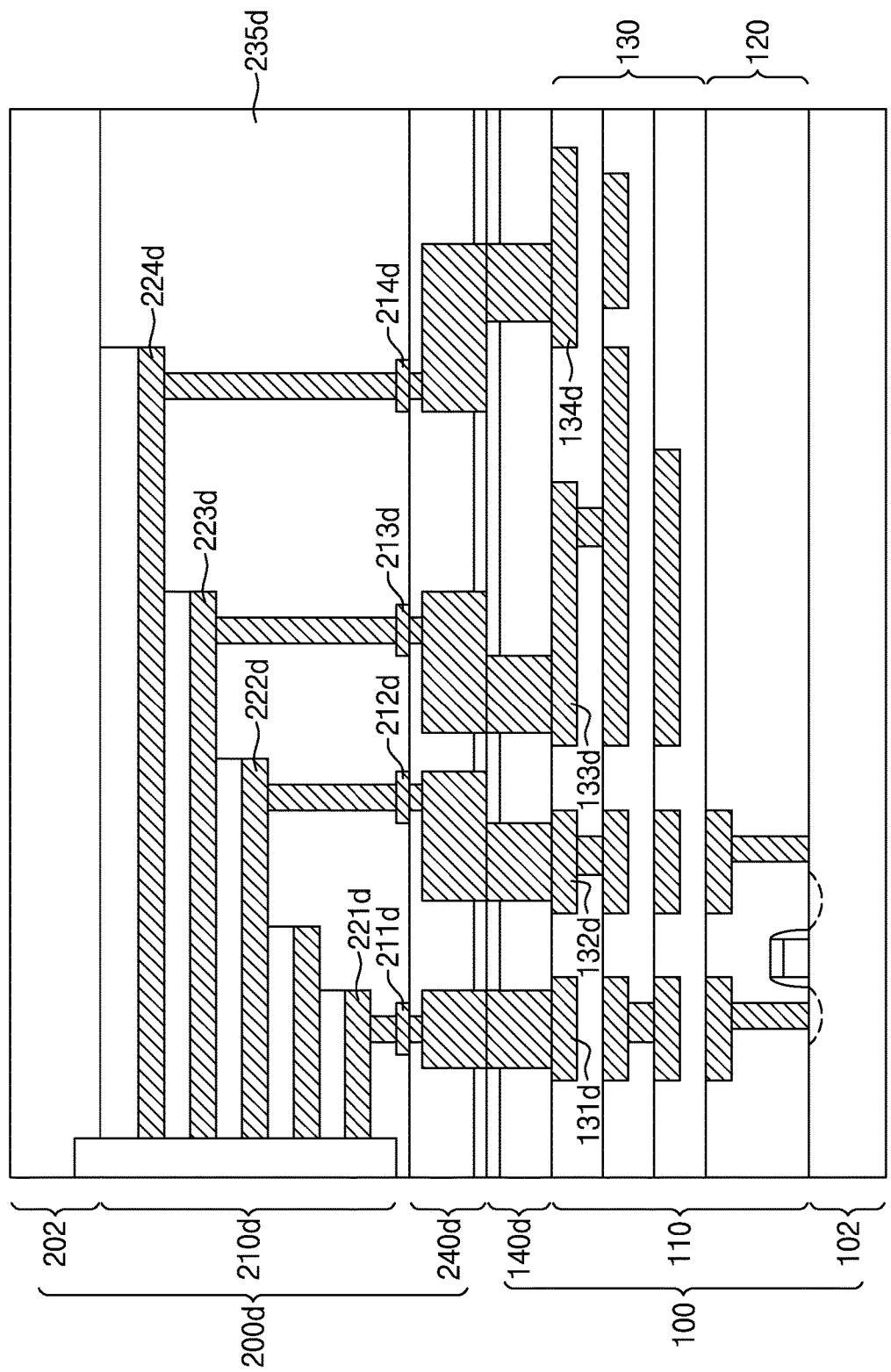
FIG. 7 is a cross-sectional view of a semiconductor device according to an example embodiment.
Figure 8:
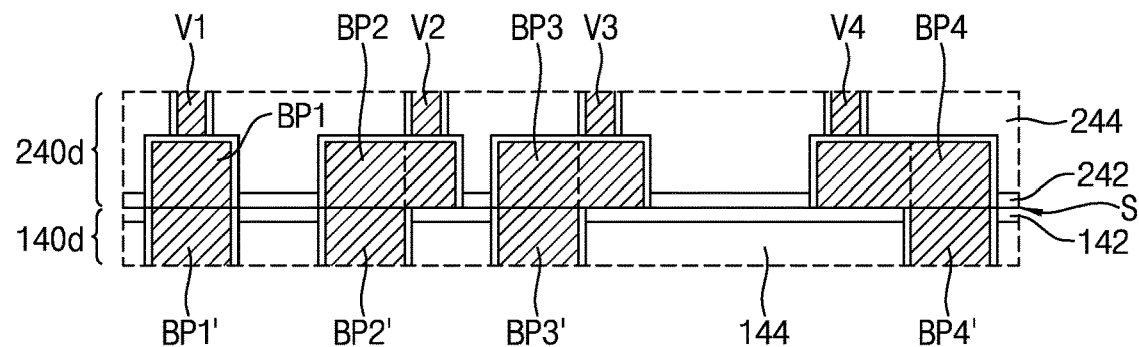
FIG. 8 is a partial enlarged cross-sectional view of the semiconductor device illustrated in FIG. 7.
Figure 9:
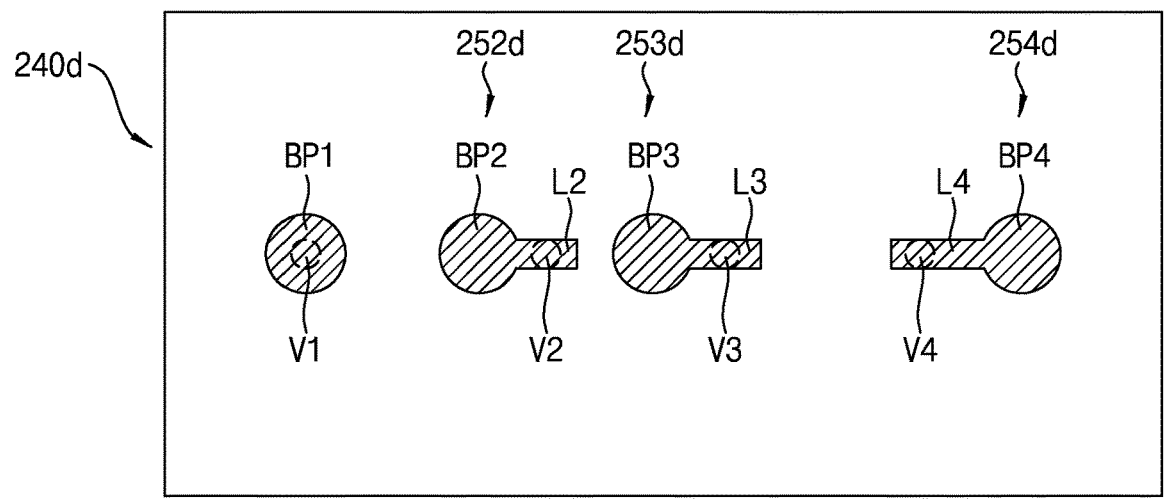
FIG. 9 illustrates plan views of a first bonding layer and a second bonding layer of the semiconductor device illustrated in FIG. 7.
Figure 9:
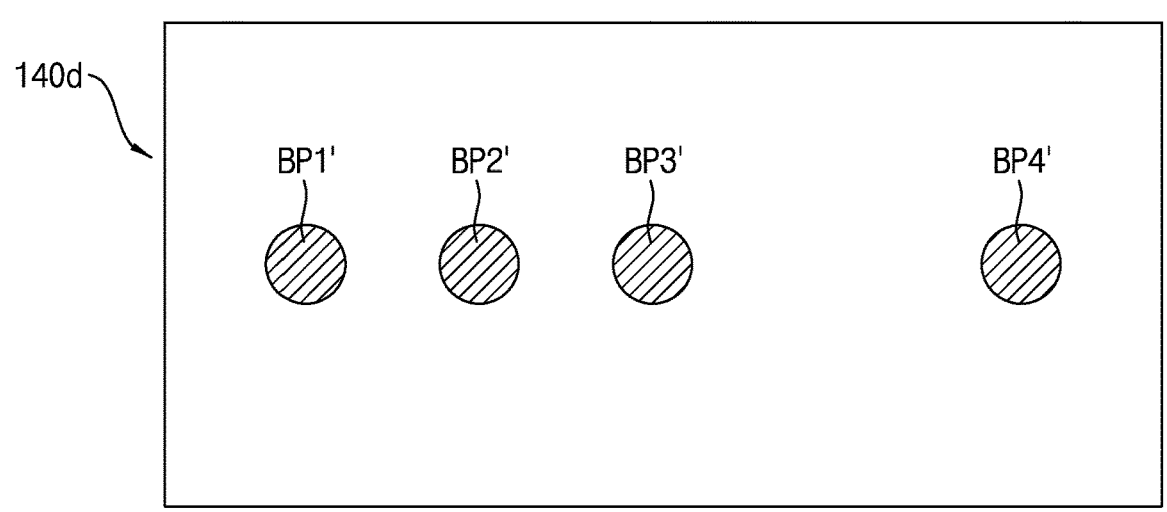

FIG. 7 is a cross-sectional view of a semiconductor device according to an example embodiment. FIG. 8 is a partial enlarged cross-sectional view of the semiconductor device illustrated in FIG. 7. FIG. 9 illustrates plan views of a first bonding layer and a second bonding layer of the semiconductor device illustrated in FIG. 7.

Referring to FIGS. 7 and 8, the semiconductor device may include a first semiconductor chip 100 and a second semiconductor chip 200d. The first semiconductor chip 100 may include a first circuit layer 110 and a first bonding layer 140d. The first circuit layer 110 may include a first element layer 120 and a first interconnection layer 130. The first interconnection layer 130 may include a plurality of layers each having a plurality of internal lines. For example, the first interconnection layer 130 may include internal lines 131d, 132d, 133d, and 134d. The first bonding layer 140d may include a first interfacial insulating layer 142, an interlayer insulating layer 144, and bonding pads BP1', BP2', BP3', and BP4'. The bonding pads BP1', BP2', BP3', and BP4' may be respectively connected to the internal lines 131d, 132d, 133d, and 134d.

The second semiconductor chip 200d may include a second bonding layer 240d, a memory layer 210d, and a second substrate 202. The first bonding layer 140d and the second bonding layer 240d may be bonded to each other along a bonding surface S. In some embodiments, the second semiconductor chip 200d may be a memory chip, e.g., a vertical NAND (VNAND) memory chip.

The memory layer 210d may include internal lines 211d, 212d, 213d, and 214d, gate electrodes 221d, 222d, 223d, and 224d, and an interlayer insulating layer 235d. The internal lines 211d, 212d, 213d, and 214d may be respectively connected to the gate electrodes 221d, 222d, 223d, and 224d. The internal lines 211d, 212d, 213d, and 214d may correspond to bit lines. The gate electrodes 221d, 222d, 223d, and 224d may correspond to word lines and may be arranged in a stacked structure, and an insulating layer may be arranged between the gate electrodes 221d, 222d, 223d, and 224d. The interlayer insulating layer 235d may cover the internal lines 211d, 212d, 213d, and 214d and the gate electrodes 221d, 222d, 223d, and 224d.

The gate electrodes 221d, 222d, 223d, and 224d may include a metal or metal nitride. For example, the gate electrodes 221d, 222d, 223d, and 224d may include tungsten, tungsten nitride, titanium, titanium nitride, tantalum, tantalum nitride, platinum, a metal nitride, or a combination thereof. The insulating layer provided between the gate electrodes 221d, 222d, 223d, and 224d may include an oxide-based material such as silicon oxide, silicon carboxide, or silicon oxyfluoride.

Referring to FIG. 9, the second bonding layer 240d may include bonding pads BP1, BP2, BP3, and BP4, bonding structures 252d, 253d, and 254d, and internal vias V1, V2, V3, and V4. The bonding structure 252d may include a bonding pad BP2 and an interconnection L2. The bonding structure 253d may include a bonding pad BP3 and an interconnection L3. The bonding structure 254d may include a bonding pad BP4 and an interconnection L4. The distances between the bonding pads BP1, BP2, BP3, and BP4 may be in the range of about 0.5 μm to about 5 μm.

The bonding pads BP1, BP2, BP3, and BP4 of the second bonding layer 240d may be respectively bonded to the bonding pads BP1', BP2', BP3', and BP4' of the first bonding layer 140d. Lower surfaces of the bonding pads BP1, BP2, BP3, and BP4 and lower surfaces of the interconnections L2, L3, and L4 may be coplanar with each other. The internal vias V1, V2, V3, and V4 may be provided on the bonding pad BP1. The internal vias V1, V2, V3, and V4 may be provided on the interconnections L2, L3, and L4.

FIGS. 10 to 16 are plan views of a first bonding layer and a second bonding layer of a semiconductor device according to an example embodiment.

Figure 10:
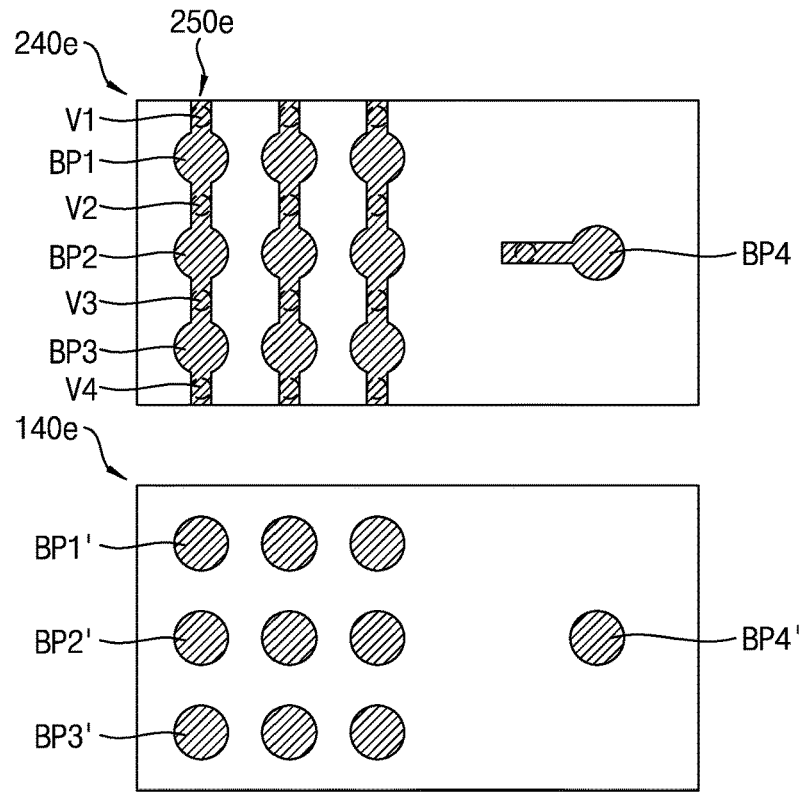
FIGS. 10 to 16 are plan views of a first bonding layer and a second bonding layer of a semiconductor device according to an example embodiment.
Figure 11:
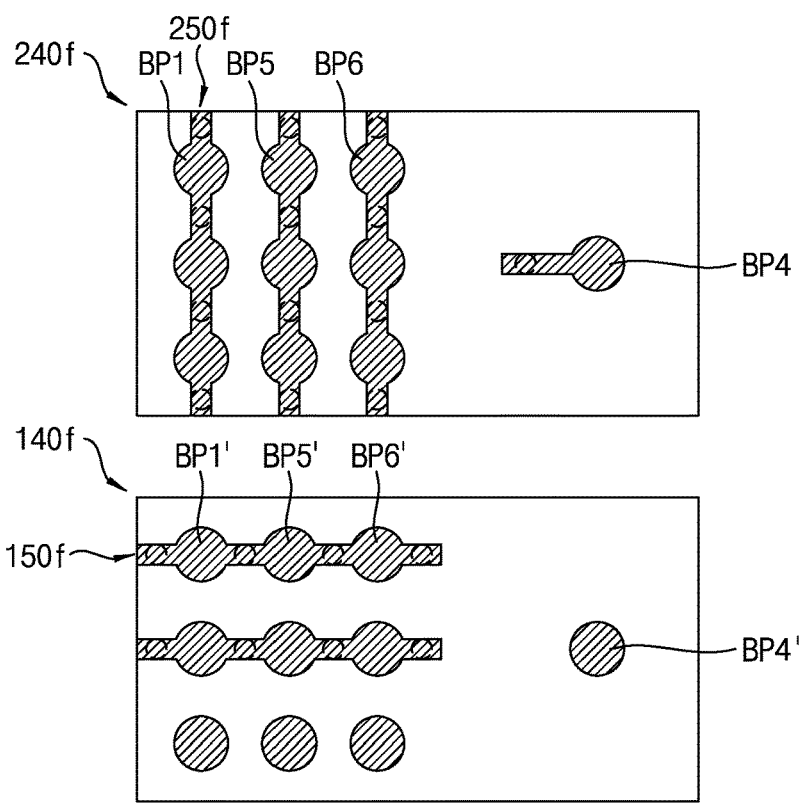

FIGS. 10 and 11 are plan views of a first bonding layer and a second bonding layer similar or corresponding to those of FIG. 9. Referring to FIG. 10, a first bonding layer 140e may include a plurality of bonding pads BP1', BP2', and BP3'. A second bonding layer 240e may include a plurality of bonding structures 250e. Each of the bonding structures 250e may include bonding pads BP1, BP2, and BP3 connected to each other. The second bonding layer 240e may further include a bonding pad BP4. A plurality of internal vias V1, V2, V3, and V4 may be provided on the bonding structure 250e. The bonding structures 250e of the second bonding layer 240e may have a bonding function and an interconnection function. For example, the bonding pad BP1' of the first bonding layer 140e may be connected to the bonding pad BP1 of the second bonding layer 240e and thus may be connected to different internal lines through the internal vias V1 and V2.

Referring to FIG. 11, a first bonding layer 140f may include a plurality of bonding structures 150f and bonding pads BP1', BP5', and BP6'. A second bonding layer 240f may include a plurality of bonding structures 250f and bonding pads BP1, BP5, and BP6. The second bonding layer 240f may have the same structure as the second bonding layer 240e of FIG. 10. The bonding pads BP1', BP5', and BP6' of the bonding structure 150f may be connected to one another. The bonding structure 150f and the bonding structure 250f may extend in different directions when viewed from above. In some embodiments, interconnections of the bonding structures 150f may be bonded to the plurality of bonding structures 250f to intersect with the plurality of bonding structures 250f. The bonding structures 150f of the first bonding layer 140f may have a bonding function and an interconnection function. For example, the bonding pad BP1 of the second bonding layer 240f may be connected to the bonding pad BP1' of the first bonding layer 140f and thus may be connected to different internal lines through a plurality of internal vias.

Figure 12:
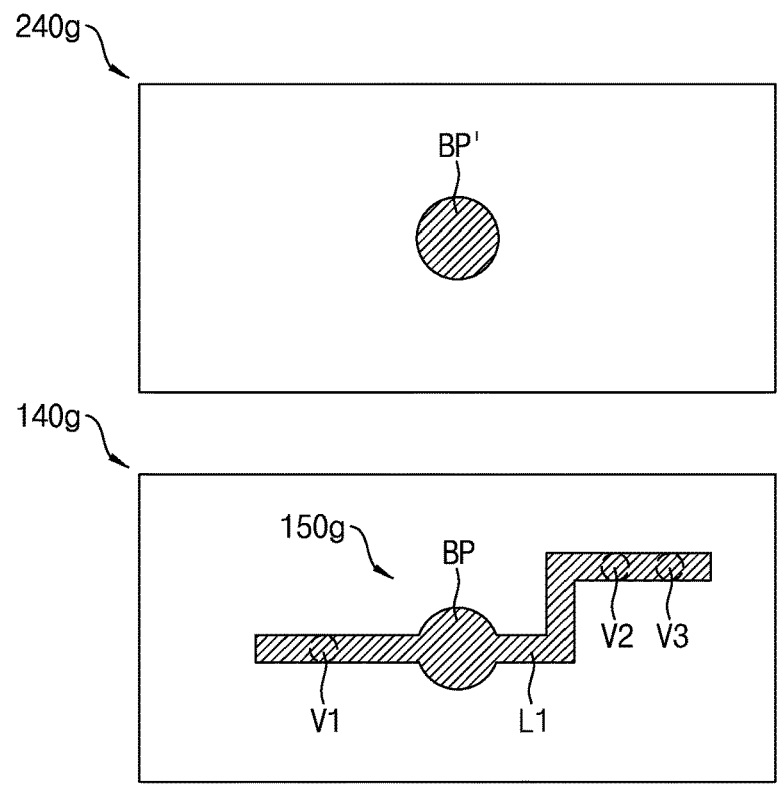
Figure 13:
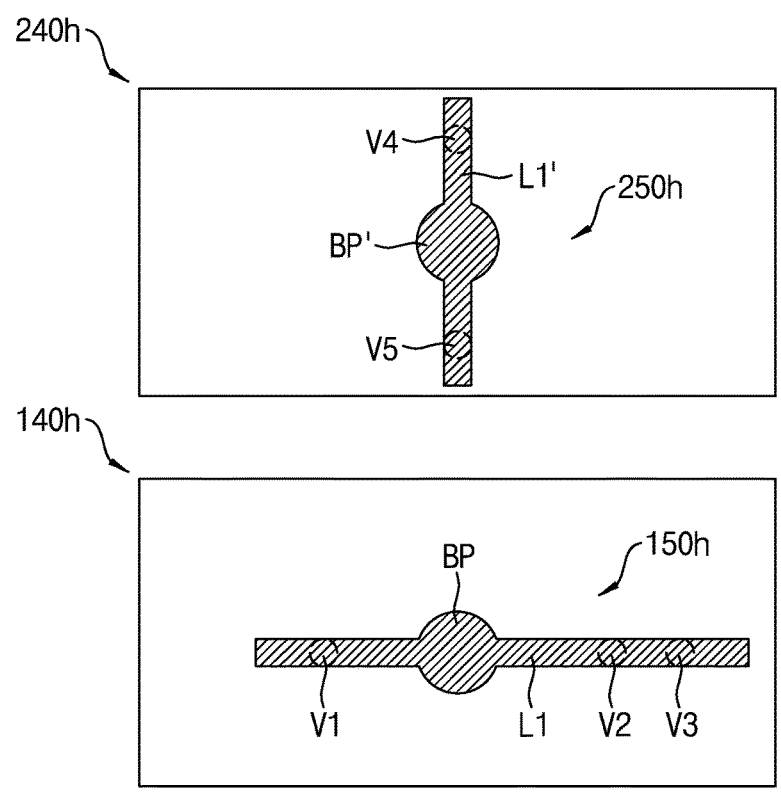

FIGS. 12 and 13 are plan views of a first bonding layer and a second bonding layer of a semiconductor device according to an example embodiment.

Referring to FIG. 12, a first bonding layer 140g may include a bonding structure 150g. A second bonding layer 240g may include a bonding pad BP'. The bonding structure 150g may include a bonding pad BP and an interconnection L1. The interconnection L1 may connect the bonding pad BP and internal vias V1, V2, and V3. The interconnection L1 may have various shapes to connect the internal vias V1, V2, and V3. For example, the interconnection L1 may have various shapes according to positions of the internal vias V1, V2, and V3 which are to be connected. In some embodiments, the interconnection L1 may have a polygonal line shape. In some embodiments, the interconnection L1 may be in the form of a line extending or bent in a diagonal direction.

Referring to FIG. 13, a first bonding layer 140h may include a bonding structure 150h. A second bonding layer 240h may include a bonding structure 250h. The bonding structure 150h may include a bonding pad BP and an interconnection L1. The interconnection L1 may be connected to internal vias V1, V2, and V3. The bonding structure 250h may include a bonding pad BP' and an interconnection L1'. The interconnection L1' may be connected to internal vias V4 and V5. The bonding pad BP' may be bonded to the bonding pad BP. As illustrated in FIG. 13, the first bonding layer 140h and the second bonding layer 240h respectively include the interconnections L1 and L having an interconnection function and thus the number of layers for interconnection may be reduced.

Figure 14:
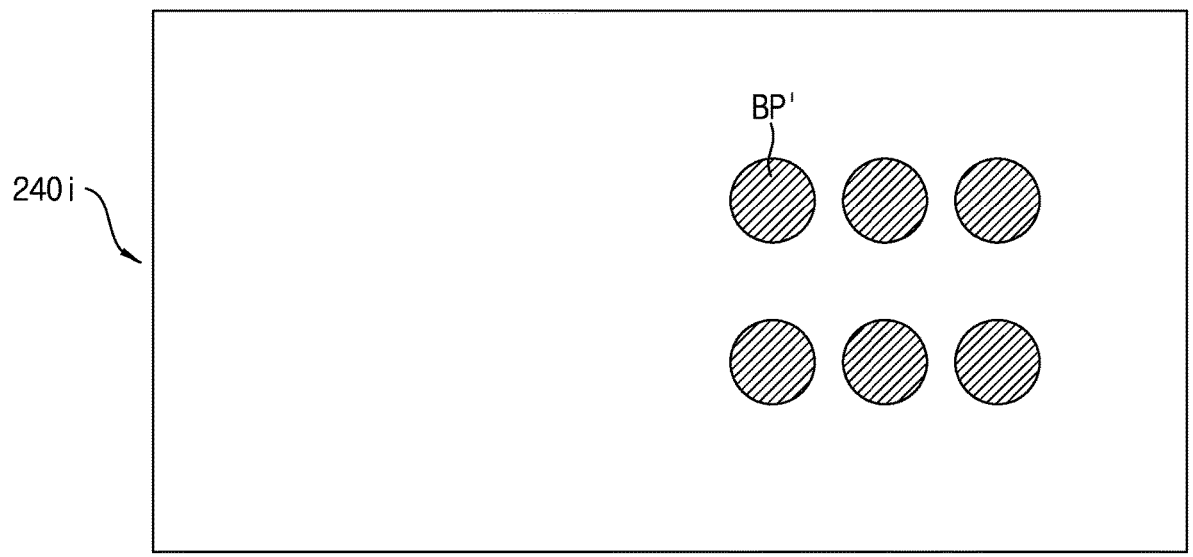
Figure 14:
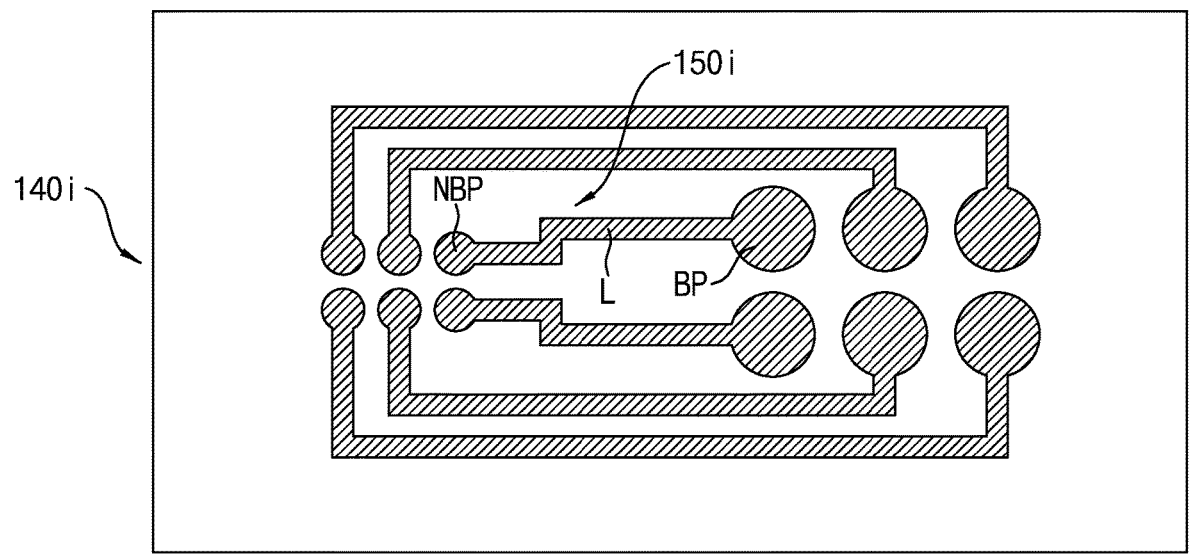

Referring to FIG. 14, a first bonding layer 140i may include a plurality of bonding structures 150i. Each of the bonding structures 150i may include a bonding pad BP, a non-bonding pad NBP, and an interconnection L. A second bonding layer 240i may include a plurality of bonding pads BP'. Each of the bonding pads BP may be connected to one of non-bonding pads NBP through the interconnection L. The non-bonding pads NBP may be electrically connected to internal lines below the first bonding layer 140i.

Figure 15:
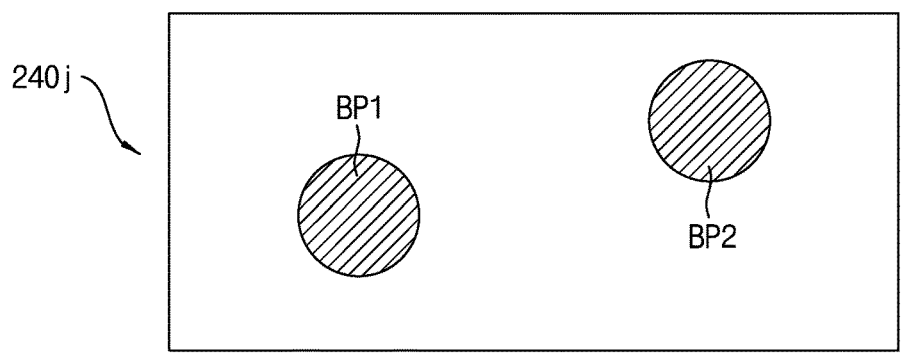
Figure 15:
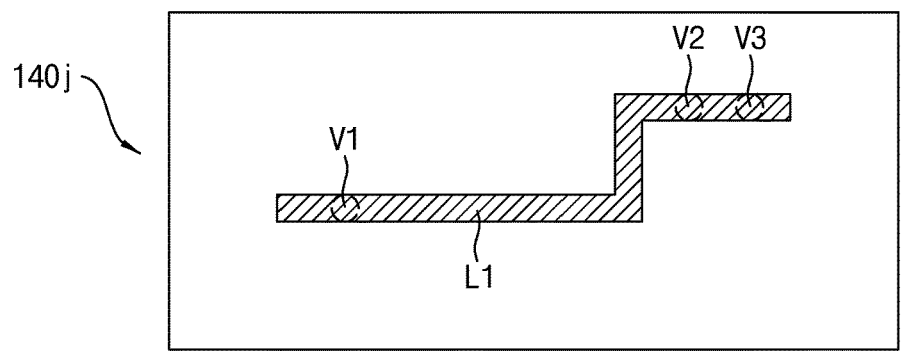

Referring to FIG. 15, a first bonding layer 140j may include an interconnection L1. A second bonding layer 240j may include bonding pads BP1 and BP2. Internal vias V1, V2, and V3 may be bonded to the bonding pads BP1 and BP2. The internal vias V1, V2, and V3 may be electrically connected to internal lines below the first bonding layer 140j. The first bonding layer 140j and the second bonding layer 240j may be bonded to each other in various patterns. In some embodiments, the interconnection L1 may be connected to the internal vias V1, V2, and V3. In some embodiments, the interconnection L1 may be connected to one internal via V1 or two internal vias V1 and V2, e.g., less than the plurality of internal vias. The bonding pad BP1 may be connected to one internal via V1, and the bonding pad BP2 may be connected to two internal vias V2 and V3. As illustrated in FIG. 15, the first bonding layer 140j includes the interconnection L1 having an interconnection function and thus various bonding patterns are applicable thereto.

Figure 16:
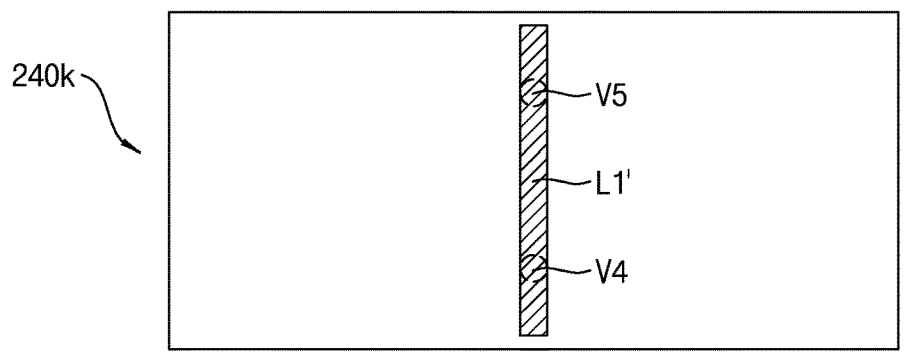
Figure 16:
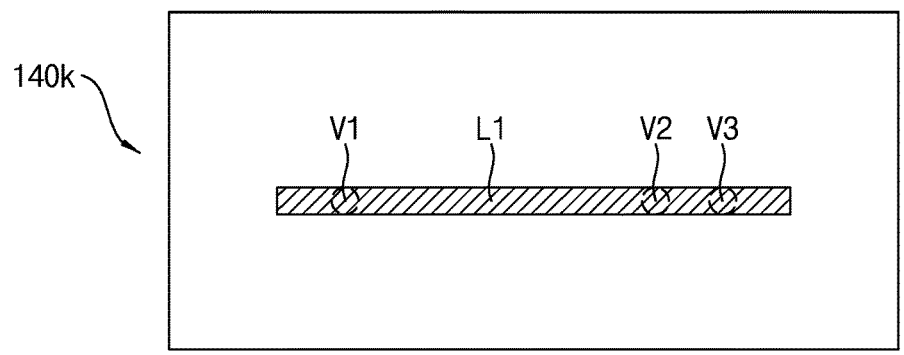

Referring to FIG. 16, a first bonding layer 140k may include an interconnection L1. A second bonding layer 240k may include an interconnection L1'. Internal vias V1, V2, and V3 may be electrically connected to internal lines below the first bonding layer 140k. Internal vias V4 and V5 may be electrically connected to internal lines on the second bonding layer 240k. The interconnection L1 and the interconnection L1' may extend to cross each other on a lateral plane, that is, to intersect in plan view. In some embodiments, interconnection L1 and the interconnection L1' may extend in diagonal directions or the same direction. As illustrated in FIG. 16, the first bonding layer 140k and the second bonding layer 240k are connected through the interconnection L1 and the interconnection L1' and thus degrees of freedom of a bonding position and a pattern may increase. In addition, even when the interconnection L1 and the interconnection L1' are misaligned (e.g., along the bonding surface S) and brought into contact with each other, a certain contact area therebetween may be maintained.

Figure 17:
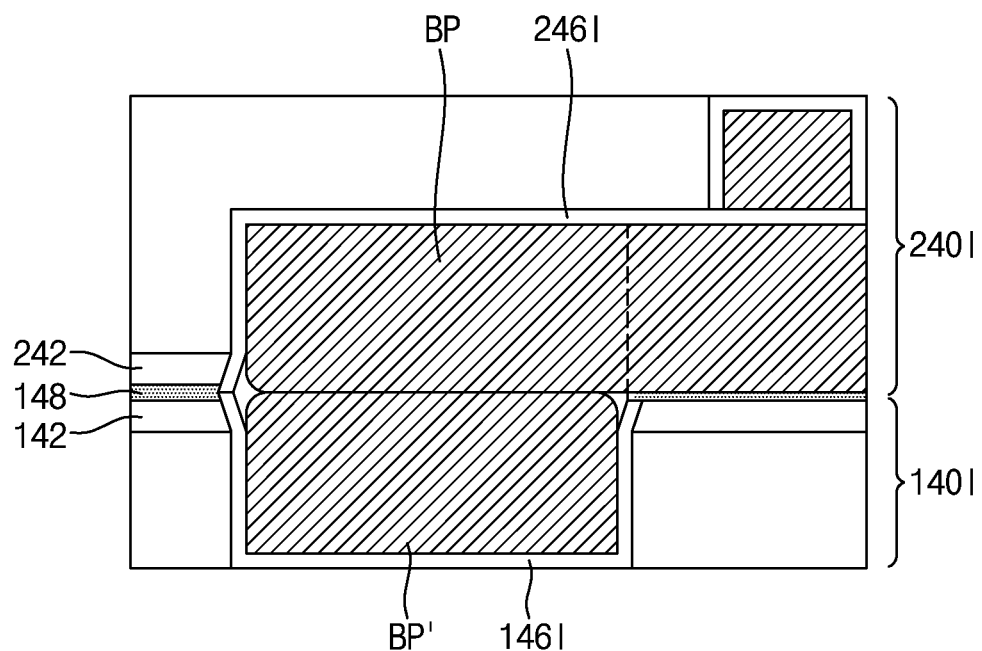
FIGS. 17 and 18 are cross-sectional views of semiconductor devices according to example embodiments.
Figure 18:
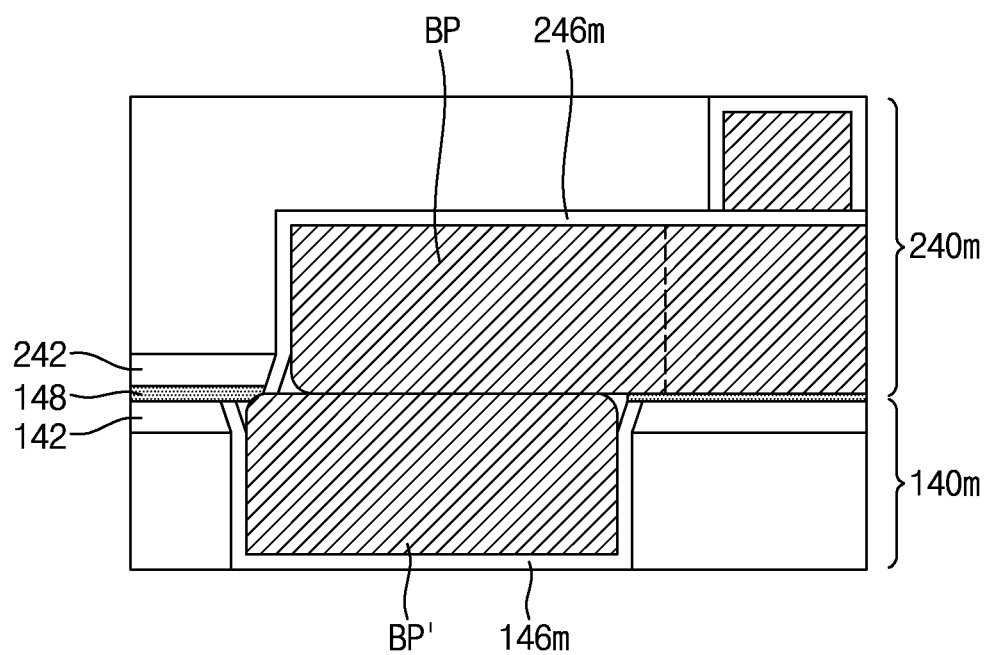

FIGS. 17 and 18 are cross-sectional views of semiconductor devices according to example embodiments. Referring to FIG. 17, a second bonding layer 240l may be provided on a first bonding layer 140l. A bonding pad BP and a bonding pad BP' may be formed to have the same width in a lateral direction and may be aligned and bonded to each other in the lateral direction. The first bonding layer 140l may include a barrier film 146l covering side surfaces and a lower surface of the bonding pad BP'. The second bonding layer 240l may include a barrier film 246l covering side surfaces and an upper surface of the bonding pad BP.

The first bonding layer 140l may include a first interfacial insulating layer 142 on an upper surface thereof. The second bonding layer 240l may include a second interfacial insulating layer 242 on a lower surface thereof. The semiconductor device may further include an interfacial oxide layer 148 between the first interfacial insulating layer 142 and the second interfacial insulating layer 242. The interfacial oxide layer 148 may be formed by oxidizing the first interfacial insulating layer 142 and/or the second interfacial insulating layer 242. For example, the interfacial oxide layer 148 may be formed by performing $O_2$ plasma treatment, $H_2$ plasma treatment, $N_2$ plasma treatment, or $NH_3$ plasma treatment on a surface of the first interfacial insulating layer 142 or the second interfacial insulating layer 242 which includes SiCN. The interfacial oxide layer 148 may increase adhesion between the first semiconductor chip 100 and the second semiconductor chip 200.

In some embodiments, the edges of surfaces of the bonding pads BP and BP' may be partially removed by chemical mechanical polishing (CMP), and thus the bonding pads BP and BP' may have round corners. A portion of the barrier film 146l on the bonding pad BP' may not be adhered to the bonding pad BP and thus may be separated from the bonding pad BP'. Similarly, a portion of the barrier film 246l may be separated from the bonding pad BP.

In some embodiments, a metal oxide may be formed between the bonding pad BP and the bonding pad BP'. The metal oxide may be formed by oxidizing the bonding pads BP and BP' and may include, for example, copper oxide such as CuO.

Referring to FIG. 18, a first bonding layer 140m may include a barrier film 146m covering side surfaces and a lower surface of the bonding pad BP'. A second bonding layer 240m may include a barrier film 246m covering side surfaces and an upper surface of the bonding pad BP. The bonding pad BP and the bonding pad BP' may be misaligned with each other. In some embodiments, the bonding pad BP and the bonding pad BP' may be misaligned and bonded to each other in the lateral direction along the bonding surface S. A portion of the bonding pad BP' may be in contact with an interfacial oxide layer 148 or a barrier film 246*m*.

According to example embodiments of the inventive concept, bonding pads and an interconnection are provided at a bonding interface of a bonding layer of a semiconductor device, and thus, the number of layers for interconnection may be reduced and various types of bonding structures may be implemented.

While embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation, the scope of the inventive concepts being set forth in the following claims.

What is claimed is:

1. A semiconductor device comprising:
    a first semiconductor chip comprising a first substrate, a first circuit layer on the first substrate and including a plurality of first internal lines, and a first bonding layer on the first circuit layer; and
    a second semiconductor chip stacked on the first semiconductor chip and comprising a second substrate, a second circuit layer below the second substrate, and a second bonding layer below the second circuit layer,
    wherein the first bonding layer comprises a first bonding pad, a plurality of first internal vias, and a first interconnection electrically connecting the first bonding pad and the plurality of first internal vias, wherein the first bonding pad has a width greater than that of the first interconnection in plan view,
    wherein the second bonding layer comprises a second bonding pad bonded to the first bonding pad,
    wherein an upper surface of the first interconnection and an upper surface of the first bonding pad are coplanar with an upper surface of the first bonding layer, and
    wherein the first interconnection is electrically connected to the plurality of first internal lines through the plurality of first internal vias.

2. The semiconductor device of claim 1, wherein a lower surface of the first bonding pad and a lower surface of the first interconnection are coplanar.

3. The semiconductor device of claim 1, wherein at least one of the plurality of first internal vias is spaced apart from the first bonding pad in a lateral direction along the upper surface of the first bonding layer, and wherein the first interconnection extends beyond the first bonding pad in the lateral direction.

4. The semiconductor device of claim 1, wherein the second bonding layer further comprises:
    a plurality of second internal vias; and
    a second interconnection electrically connecting the second bonding pad and the plurality of second internal vias,
    wherein a lower surface of the second interconnection and a lower surface of the second bonding pad are coplanar with a lower surface of the second bonding layer.

5. The semiconductor device of claim 4, wherein the second bonding pad has a width greater than that of the second interconnection in plan view.

6. The semiconductor device of claim 1, wherein the first bonding pad and the second bonding pad are misaligned in a lateral direction along the upper surface of the first bonding layer and bonded to each other, and wherein the first bonding pad is in contact with a portion of a barrier film on the second bonding pad and/or an interfacial oxide layer between the first bonding layer and the second bonding layer.

7. The semiconductor device of claim 1, wherein the first bonding layer comprises
    a first interlayer insulating layer contacting the first bonding pad, the plurality of first internal vias and the first interconnection, and
    a first interface insulating layer on an upper surface of the first bonding layer, wherein the first interface insulating layer extends on the first interlayer insulating layer, and
    wherein the second bonding layer comprises
    a second interlayer insulating layer contacting the second bonding pad, and
    a second interface insulating layer on a lower surface of the second bonding layer, wherein the second interface insulating layer extends on the second interlayer insulating layer.

8. The semiconductor device of claim 7, further comprising an interfacial oxide layer between the first interface insulating layer and the second interface insulating layer.

9. The semiconductor device of claim 1, further comprising a through silicon via that passes through the second substrate, the second bonding layer and the first bonding layer, wherein the through silicon via is connected to at least one of the plurality of first internal lines.

10. The semiconductor device of claim 1, wherein the first semiconductor chip is a logic chip, and the second semiconductor chip is a pixel array chip comprising one or more photoelectric conversion regions therein.

11. The semiconductor device of claim 1, wherein the first semiconductor chip is a logic chip, and the second semiconductor chip is a memory chip comprising word lines and bit lines therein.

12. The semiconductor device of claim 1, wherein the first bonding pad and the second bonding pad have different widths.

13. A semiconductor device comprising:
    a first semiconductor chip comprising a first substrate, a first circuit layer on the first substrate, and a first bonding layer on the first circuit layer; and
    a second semiconductor chip stacked on the first semiconductor chip and comprising a second substrate, a second circuit layer below the second substrate and including a plurality of second internal lines, and a second bonding layer below the second circuit layer,
    wherein the first bonding layer comprises a plurality of first bonding pads and a first interconnection connecting the plurality of first bonding pads, and
    the second bonding layer comprises a plurality of second bonding pads and a second interconnection connecting the plurality of second bonding pads and a plurality of second internal vias, the plurality of second bonding pads bonded to the plurality of first bonding pads, and
    wherein a lower surface of the second interconnection is coplanar with respective lower surfaces of the plurality of second bonding pads, and
    the plurality of second bonding pads are connected to the plurality of second internal lines through the plurality of second internal vias.

14. The semiconductor device of claim 13, wherein the first interconnection extends beyond the first bonding pads in a first direction, and wherein the second interconnection extends beyond the second bonding pads in a second direction.

15. The semiconductor device of claim 14, wherein the first interconnection and the second interconnection are bonded to each other in a region in which the first interconnection and the second interconnection cross each other.

16. The semiconductor device of claim 13, further comprising a through silicon via that passes through the second substrate, the second bonding layer and the first bonding layer, wherein the through silicon via is connected to at least one of a plurality of first internal lines.

17. A semiconductor device comprising:
a first semiconductor chip comprising a first substrate, a plurality of first internal lines, and a first bonding layer on the plurality of first internal lines; and
a second semiconductor chip stacked on the first semiconductor chip and comprising a second substrate, and a second bonding layer below the second substrate,
wherein the first bonding layer comprises a first bonding pad, at least one non-bonding pad, and a first interconnection connecting the first bonding pad and the at least one non-bonding pad,
the second bonding layer comprises a second bonding pad bonded to the first bonding pad,
an upper surface of the first interconnection and an upper surface of the first bonding pad are coplanar with an upper surface of the first bonding layer,
the at least one non-bonding pad has a width greater than a width of the first interconnection and less than a width of the first bonding pad in plan view, and
the first interconnection is connected to the plurality of first internal lines through the at least one non-bonding pad.

18. The semiconductor device of claim 17, wherein a lower surface of the first bonding pad and a lower surface of the first interconnection are coplanar.

19. The semiconductor device of claim 17, wherein the at least one non-bonding pad and the second bonding pad are misaligned in a lateral direction along the upper surface of the first bonding layer and bonded to each other.

\* \* \* \* \*